(12) United States Patent
Kanagawa et al.

(10) Patent No.: US 8,106,523 B2
(45) Date of Patent: Jan. 31, 2012

(54) LIQUID RESIN COMPOSITION, SEMI-CONDUCTOR DEVICE, AND PROCESS OF FABRICATING THE SAME

(75) Inventors: Naoki Kanagawa, Yokkaichi (JP); Yasutaka Miyata, Yokkaichi (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 171 days.

(21) Appl. No.: 12/435,639

(22) Filed: May 5, 2009

(65) Prior Publication Data
US 2009/0261484 A1 Oct. 22, 2009

(51) Int. Cl.
*H01L 23/29* (2006.01)
*C08L 69/00* (2006.01)

(52) U.S. Cl. .............. 257/793; 257/E23.119; 524/611

(58) Field of Classification Search .......... 257/793, 257/E23.119; 524/611
See application file for complete search history.

(56) References Cited

U.S. PATENT DOCUMENTS 4,111,713 A * 9/1978 Beck .............................. 106/409
5,342,876 A * 8/1994 Abe et al. ...................... 524/493

FOREIGN PATENT DOCUMENTS

| JP | 58-138728 A | | 8/1983 |
|---|---|---|---|
| JP | 07196310 A | * | 8/1995 |
| JP | 8-41173 A | | 2/1996 |
| JP | 8-85719 A | | 4/1996 |
| JP | 2001-181479 A | | 7/2001 |
| JP | 2002-338230 A | | 11/2002 |
| JP | 2004-27005 A | | 1/2004 |
| JP | 2005-264037 A | | 9/2005 |
| JP | 2006-62902 A | | 3/2006 |
| JP | 2006-232950 A | | 9/2006 |
| JP | 2006-233016 A | | 9/2006 |

OTHER PUBLICATIONS

Notification of Reasons for Refusal for Application No. 2006-343323 from Japan Patent Office mailed Jun. 7, 2011.
Notification of Reasons for Refusal for Application No. 2006-343323 from Japan Patent Office mailed Sep. 20, 2011.

* cited by examiner

*Primary Examiner* — Lex Malsawma
(74) *Attorney, Agent, or Firm* — Cheng Law Group, PLLC

(57) ABSTRACT

A liquid resin composition for use as a sealing resin which reduces wear on a dicing blade or grinder employed for signularization or grinding. The liquid resin composition includes hollow and/or porous particles as a filler, and is adapted in use to be applied on a substrate constituting a semi-conductor device or electronic part.

11 Claims, 1 Drawing Sheet

LIQUID RESIN COMPOSITION, SEMI-CONDUCTOR DEVICE, AND PROCESS OF FABRICATING THE SAME

TECHNICAL FIELD

The present invention is directed to a liquid resin composition, a semi-conductor device utilizing the liquid composition, and a process of fabricating the same. The liquid resin is particularly applied in a technical field which requires minimizing warp of a sealing site, for example, an encapsulant for encapsulating a chip size package (CPS), an under-fill resin for mounting a chip on a substrate, and a sealing resin covering a printer head for thermal transfer printer or thermal printer.

BACKGROUND ART

It has been known to use a dielectric sealing material for sealing or encapsulating a semi-conductor chip or electronic part. Generally, liquid epoxy resin has been used as the sealing material which is coated on a part followed by being cured by heat. To satisfy a demand of minimizing warp of the encapsulated or sealed part, it has been proposed to include an inorganic filler such as silica or alumina in the sealing resin, and/or to reduce elasticity of the resin in an attempt to reduce a difference in coefficient of linear thermal expansion between the resin and the part, or reduce elasticity of the resin, thereby minimizing a stress developed between the resin and the part, for example, as disclosed in and JP2004-27005 A and JP 2006-232950 A. The inorganic filler such as silica or alumina is found advantageous to lower the coefficient of linear thermal expansion as close as that of the part when incorporated in a large amount. However, as the inorganic filler is incorporated in a larger amount, there arises a problem that the inorganic filler is likely to cause more serious wear on a dicing blade or grinder which is necessarily used in a process of singulation or grinding of the device, thereby lowering manufacturability with an increased cost.

DISCLOSURE OF THE INVENTION

In view of the above insufficiency, the present invention has been accomplished to provide a room temperature liquid resin composition which is adapted in use to be applied to a substrate of an electronic component as a sealing resin, and which is capable of reducing wear on a dicing blade used for cutting the substrate and the cured resin. The liquid composition in accordance with the present invention includes 60% to 90% by weight of filler particles, an epoxy resin, and a curing agent. The cured layer sees only a small coefficient of linear thermal expansion and therefore only minimum warp when the filler particles are incorporated 60% or more by weight, while the liquid resin maintains sufficient fluidity for easy handling when the filler particles are incorporated 90% or less by weight. The filler particles include 40% or more by weight of porous and/or hollow particles. The epoxy resin is included to give improved reflow resistance. The presence of the porous and/or hollow particles can successfully reduce the wear on the dicing blade or the like cutting tool when the cured resin is cut into pieces, or singulated into individual electronic parts.

The porous and/or hollow particles may have a porosity of 10% to 70% for reducing the wear on the blade, while maintaining sufficient mechanical strength given to the resin coated product.

Preferably, the particles are bake-finished to have their surface sealed for reducing a specific surface, thereby restraining increases of resin viscosity, thixotropic index, and hydroscopicity.

The particles are preferred to have a maximum particle size of 1 μm to 40 μm in order to successfully form a sealing resin layer having a thickness of as less as 50 μm, while reducing resin viscosity and thixotropic index.

Further, the filler particles are preferably made of spherical amorphous silica. The sphericalness of the particles is advantageous for restraining an undue increase of the viscosity, while reducing damages on the surface of a wafer or the like to which the liquid composition is applied. The amorphous silica can reduce the coefficient of linear thermal expansion of the cured resin.

The epoxy resin may be at least one selected from a group consisting of bisphenol-A epoxy resin, bisphenol-F epoxy resin, biphenyl epoxy resin, naphthalene-ring containing epoxy resin, hydrogenated epoxy resin thereof, alicyclic epoxy resin, and polyalkylene glycol skelton containing epoxy resin. With the combination use of such epoxy resin, it is easy to have an optimum glass transition temperature (Tg) for achieving sufficient viscosity or fluidity advantageous in forming the resin layer as well as for minimizing the warp on the product covered by the cured resin.

The curing agent is preferably a compound which has a plurality of phenolic hydroxyl groups per one molecule. The compound makes the curd resin free from hydrolysis and assures improved moisture resistance even at the lowered glass transition temperature.

The present invention also relates to a process of fabricating semiconductor devices with the use of the above room-temperature liquid resin composition. The process includes steps of coating the liquid resin composition on a resin substrate, ceramic substrate, or wafer by means of a reduced pressure printing machine, heating the composition to cure, and singulating the substrate or wafer into individual parts of the semiconductor devices. This process enables to fabricate the warp-free semi-conductor devices with enhanced reliability at a reduced manufacturing cost and tact time, and leaving no void in the resulting resin layer.

Further, the present invention includes a semi-conductor device which is composed of a semi-conductor chip formed on its one surface with a semiconductor circuit, a resin layer superimposed on the semi-conductor chip over the circuit; and a plurality of electrodes connected to the semi-conductor chip and extending through the resin layer, wherein the resin layer is formed from the above liquid composition. The semi-conductor device employing the above resin composition can have reduced warp and therefore less internal stress for realizing excellent resistance to cyclical exposure to varying temperatures and moisture resistance, and also for reducing warp resulting from thermal hysteresis when subjected to reflow soldering.

BEST MODE FOR CARRYING OUT THE INVENTION

Figure 1:
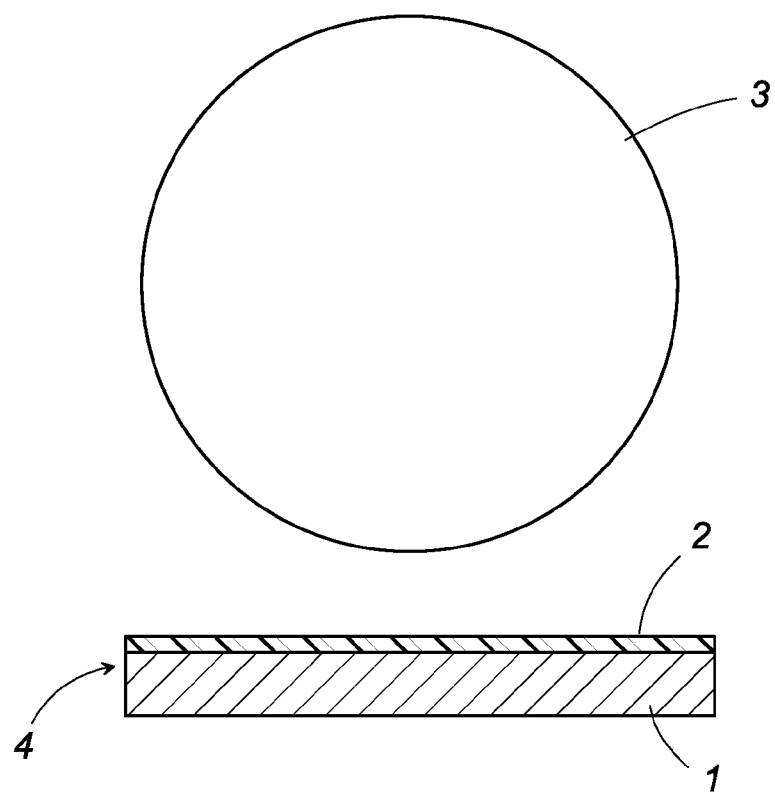
FIG. 1 is a schematic section showing a manner of singularizing a substrate or wafer coated with a resin layer cured from a resin composition in accordance with the present invention.

Now, the present invention is explained with reference to an embodiment. The liquid composition of the present invention is a room temperature liquid which includes filler particles and is adapted in use to be applied to a surface of an electronic component or substrate of a semiconductor device for sealing or encapsulating the same. The liquid composition includes 60% to 90% by weight of filler particles, an epoxy resin, and a curing agent. Essentially, the filler particles include porous and/or hollow particles for the purpose of reducing wear on a dicing blade or the like employed to cut or singulate the resin coated substrate or component. The filler particles are incorporated in an amount of 60% to 90% by weight based on the total amount of the liquid composition based on the finding that the cured resin sees a high coefficient of linear thermal expansion relative to the substrate and gives rise to undesired warp when the filler particles are less than 60% by weight, and the resin sees insufficient fluidity when the filler particles are above 90% by weight. Although it may be possible to increase the amount of solvent for giving sufficient fluidity, even when 90% by weight of the particles are incorporated, it would bring about the increase of thixotropic index and therefore isignficant lowering of manufacturabilty, and would also cause a disadvantage that the particles appear on the cured resin layer after the resin layer is cured by heat due to insufficiency of the resin content, and therefore lower the sealing effect. The filler particles include 40% or more by weight of porous and/or hollow particles. With the presence of the porous and/or hollow particles in such proportions, it is made to reduce the wear on the dicing blade or the like cutting tool when the cured resin is cut into pieces, or singulated into individual electronic parts.

The filler particle may be selected from silica, alumina, aluminum nitride, boron nitride, silicon nitride, silicon carbide, and calcium carbonate. Among these, amorphous silica is effective because of its lowest coefficient of linear thermal expansion. Especially, spherical amorphous silica is mostly preferred by its sphericalness which is responsible for restraining a viscosity increase to reduce damage on the surface of the wafer where an electrical circuit is formed.

The porous and/or particle are preferred to have a porosity of 10% to 70% in order to improve an effect of reducing the wear on the blade or the like, while retaining sufficient stiffness. In contrast, only insufficient wear reducing effect is expected at less than 10% of porosity, and the particles suffer from reduced stiffness at more than 70% of porosity. When using the particle having a porosity exceeding 50%, the particle can be treated with epoxy silane or amino silane to be well compatible with a resin content so that the particle can be uniformly dispersed in the resin content only by moderate stirring, for the purpose of preventing particle cracking while blending the particles with the resin content.

Further, the particles are preferably bake-finished to have their surface sealed so as to restrain the specific surface at a reduced level for avoiding undue increase of the viscosity, thixotropic index, and moisture absorption. Also with the surface sealing, the resin content can be well prevented from being entrapped within the surface pores of the particles as seen in the gel permeation chromatography, which would otherwise lower the reactivity. Further, the baking is preferred to be made at a temperature of 1500° C. to 2000° C. to give a high stiffness to the resulting shell of the particles, and therefore avoid cracks in the cured resin.

The particle is preferred to have a maximum particle size of 1 μm to 40 μm for successfully forming a resin layer of about 50 μm with reduced resin viscosity and thixotropic index. As far as the particle has the maximum size of 1 μm to 40 μm, optimum fluidity can be obtained by suitably distributing the particles of different sizes within this range. Below 1 μm, the particles are given an extremely great specific surface to thereby increase the viscosity and thixotropic index significantly. Above 40 μm, the particles are likely to extend through the resin layer of 50 μm, thereby detracting from the sealing effect.

The epoxy resin is employed as a main resin content in order to improve heat-resistance to reflow soldering as compared to thermoplastic resin, and therefore make the resin composition as a highly reliable sealing material. For the purpose of realizing highly reliable heat-resistance to the reflow soldering, the epoxy resin may be at least one selected from a group consisting of bisphenol-A epoxy resin, bisphenol-F epoxy resin, biphenyl epoxy resin, naphthalene-ring containing epoxy resin, hydrogenated epoxy resin thereof, alicyclic epoxy resin, and polyalkylene glycol skeleton containing epoxy resin (e.g., polypropylene skeleton containing epoxy resin). When using two or more kinds of above listed epoxy resin in combination, it is easy to have an optimum glass transition temperature (Tg) for achieving sufficient viscosity or fluidity when forming the resin layer and for minimizing the warp on the cured resin or the part covered by the cured resin.

Further, the curing agent is preferably a compound having a plurality of phenolic hydroxyl groups per one molecule such that the cured resin can be free from hydrolysis and have improved moisture resistance even at the lowered glass transistion temperature. In addition, when the liquid resin composition is spread over to form a thin resin layer and is subsequently cured, this particular curing agent can remain in the thin resin layer without being quickly evaporated, and therefore is most suitable for this particular use.

The liquid resin composition may further include an elastomer such as a silicone rubber for restraining warp of the cured product. The silicon rubber is incorporated in an amount of 2% to 5% by weight based upon the whole content of the liquid resin composition.

Insofar as causing no adverse effect, the liquid resin composition of the present invention may include additional ingredients as necessary. Such additional ingredient may be a dispersion stabilizer, flame-detardant, adhesion promoter, thixotrope-enchancer, coloring agent, dilutant, defoamer, or coupling agent.

The liquid resin composition can be prepared by uniformly intermingle the ingredients with a use of a stirrer, beads-mill or triple-roll mill.

The liquid resin composition thus prepared can be used in an application which requires minimum warp on the cured product, for example, for the semi-conductor device including a chip size package (CPS) encapsulated or sealed by the cured resin, and a flip-chip mounted on a substrate and underfilled by the resin, or a printer head for thermal transfer printer or thermal printer covered by the resin.

The semi-conductor device is fabricated by use of the liquid resin composition. The liquid resin composition is applied over a ceramic substrate or wafer by use of a reduced-pressure printer followed by being heat-cured to form the resin layer 2, as shown in FIG. 1. Then, a dicing blade 3 is employed to singularize the resin coated substrate into the semi-conductor devices. With this fabrication process, the semi-conductor device with minimum warping can be manufactured reliably at a reduced cost and tact-time, while leaving no voids in the resin layer 2. Further, the presence of the porous or hollow particles can reduce the wear on the dicing blade 3.

Instead of the reduced-pressure printing, the liquid resin composition can be equally applied to surfaces of various parts such as by an atmospheric pressure printing technique, spin coating technique, a dispensing technique, or even by us of a die mold. When using the spin-coater, the resin composition is preferred to keep its viscosity of less 10 Pa·s or less by increasing the amount of the solvent. When using the die mold, resin composition is preferred to have a viscosity of as much as 200 Pa·s without using the large amount of the solvent which might otherwise cause voids in the cured resin. In an optimum sense, the reduced-pressure printing is preferred with the boiling temperature of the solvent being made higher for continued printing.

Further, when printing the liquid resin composition, the composition is preferred to have the viscosity of 200 Pa·s or less, in view of that only poor transfer of the resin is seen when the viscosity exceeds 200 Pa·s and requires frequent squeezing. Also, even when the solvent could be added to lower the viscosity to less than 200 Pa·s, the solvent in an amount exceeding 10% by weight is likely to remain in the cured resin to thereby make the resin brittle, and/or leave voids in the resin. Accordingly, the amount of the solvent is limited to 10% by weight or less. Further, in order to reduce the voids, it might be possible to use solvents of different boiling points and to evaporate the solvents sequentially and gradually starting from the solvent of lower boiling point, when using the printing other than vacuum printing. In this sense, the use of the solvent having the boiling point higher than the maximum curing temperature of the resin by 50° C. to 100° C. can restrain abrupt evaporation of the solvent and therefore evaporate the same gradually, leaving no substantial voids without the necessity of elongating the curing time.

Figure 2:
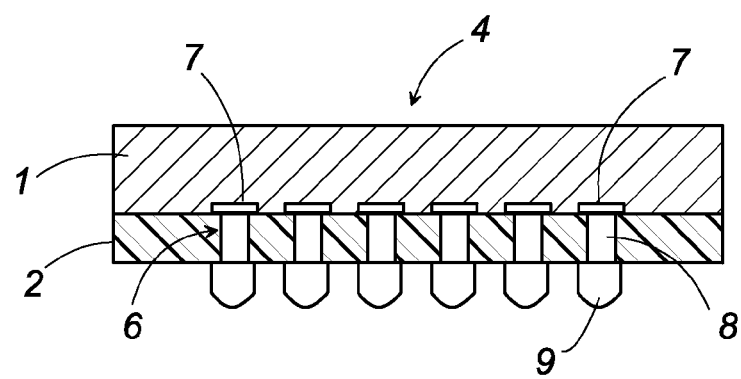
FIG. 2 is a section of a semi-conductor device in accordance with the present invention.

As shown in FIG. 2, the liquid resin composition can be suitably applied to a semi-conductor chip 4 such as a silicon chip formed on its one surface 5 with a semi-conductor circuit and having a plurality of electrodes extending through a resin layer 2 formed by the resin composition to be superimposed on the chip over the circuit surface. The semi-conductor chip is referred to generally as a chip size package (CSP) or sometimes as wafer-level CSP or wafer-scale CSP in view of the processing made prior to the singularization of the semiconductor chip 4.

When fabricating the wafer-level CSP, the wafer is formed on individual pads 7 with a metal that forms posts 8 extending through a subsequently formed resin layer 2. The pads are located at positions corresponding to bumps of each singularized CSP. The posts are developed by printing flux on the pads 7, placing solder balls respectively on the pads by use of a metal mask for reflow soldering, by reflow soldering solder paste printed on the pads, or by plating copper or the like metal on the pads. Then, the liquid resin composition is printed on the wafer thus formed with the posts 8 followed y being heat-cured. The resin composition is applied preferably with the reduced-pressure printing. When making the atmospheric printing, it is preferred to place the printed wafer in a reduced-pressure environment so as to reduce the voids. The curing is made preferably under pressure to prevent the advent of the voids, and is made through two-step curing in which the curing is made first for 30 minutes to 2 hours at a temperature of 80° C. to 140° C., and subsequently for 1 to 6 hours at a temperature of 150° C. to 210° C. When using the curing agent of the compound having phenolic hydroxyl groups, the resin can be made by a single step, i.e., heated for 30 minutes to 6 hours at a temperature of 100° C. to 210° C., as well as through the above two-step curing.

Thereafter, the cured resin on the wafer is polished to flush the resin layer 2 in level with the posts 8. As necessary, the wafer may have its rear surface polished to reduce its thickness.

Since the cured resin layer exhibits optimum glass transition temperature (Tg), elasticity, and coefficient of linear thermal expansion, the wafer thus polished sees only warp as less as 1 mm or below, when the resin layer 2 of 50 μm thickness is formed on a 8-inch diameter wafer of 250 μm thickness. Further, the warping only as less as 1 mm or below can be seen on the same wafer even after processed with the reflow-soldering. In addition, the liquid resin composition or another resin may be applied and cured on the rear surface of the wafer for protection of the semi-conductor chip 4 or marking.

Subsequently, the bumps 9 are formed on the resin layer 2 to be coupled respectively to the posts 8. The bumps can be realized by printing flux on the exposed ends of the posts 8 and placing the solder balls thereon with the use of a metal mask for reflow-soldering, or by printing the solder pastes on the posts for reflow-soldering.

The wafer thus prepared is singularized into the individual CSP furnished with the metallic electrodes 6 composed of the posts 8 and the bumps 9. By taking the advantage of the epoxy resin composition having superior adhesiveness, optimum coefficient of liner thermal expansion, and lowered internal stress resulting from minimum warp, the CPS is given superior thermal cycle resistance as well as moisture resistance.

In short, thus fabricated semi-conductor device with the resin layers cured from the liquid resin composition is found to exhibit only reduced warp to lower the internal stress, thereby assuring improved thermal cycle resistance as well as moisture resistance, yet reducing the warp due to the thermal history experienced during the reflow soldering.

The present invention is now explained by way of examples.

EXAMPLES 1 TO 5, AND COMPARATIVE EXAMPLES 1 TO 3

Liquid resin compositions of Examples 1 to 5 and Comparative Examples 1 to 3 were prepared from ingredients and methods as listed in Table 1 below. All parts are by weight.

The ingredients listed in Table 1 are as follows:

Filler Particles

Amorphous silica (available from MRC Unitec Co., Ltd. under the trade name of "QS9", average particle size of 9 μm, maximum particle size of 35 μm);

Amorphous silica (available from Admatechs Co Ltd. under the trade name of "SO25H", average particle size of 0.6 μm, maximum particle size of 3.5 μm);

Hollow silica (spherical amorphous silica, average particle size of 3 μm, maximum particle size of 25 μm, porosity of 50%)

Porous silica (spherical amorphous silica, bake-finished to have sealed surface, average particle size of 10 μm, maximum particle size of 30 μm, porosity of 20%);

Porous silica (spherical amorphous silica, bake-finished to have sealed surface, average particle size of 2 μm, maximum particle size of 25 μm, porosity of 17%); and Porous silica (spherical amorphous silica, average particle size of 6 μm, maximum particle size of 30 μm, porosity of 33%)

Epoxy Resin

Bisphenol-F epoxy resin (available from Tohto Kasei Co., Ltd. under the trade name of "YDF8170", epoxy equivalent of 160);

Bisphenol-A epoxy resin (available from Tohto Kasei Co., Ltd. under the trade name of "YDF8125", epoxy equivalent of 175);

Alicyclic epoxy resin (available from Daicel Chemical Industries, Ltd. under the trade name of "CEL2021", epoxy equivalent of 135);

Naphthalene ring containing epoxy resin (available from DIC corporation under the trade name of "HP4032D", epoxy equivalent of 141); and
Polypropylene skeleton containing epoxy resin (available from Tohto Kasei Co., Ltd. under the trade name of "PG207GS", epoxy equivalent of 319)
Curing Agent
Allyl phenol (available from Meiwa Plastic Industries Ltd. under the trade name of "MEH8000H", hydroxyl equivalent of 141);
Acid anhydrate (available from DIC corporation, under the trade name of "B650", acid anhydrate equivalent of 168)
Low Elastic Agent
Silicone rubber
Solvent
Diethylene glycol diethyl ether (boiling point of 180° C.)
Dimethylpropylene glycol (boiling point of 170° C.)
Dibuthyl diglycol (boiling point of 250° C.)
Curing Accelerator
Microcapulated latent curing accelerator (available from Asahi Kasei Corporation under the trade name of "HXA3792"
Colorant
Carbon black (available from Mitsubishi Chemical Corporation under the trade name of "MA100")
Coupling agent and dispersant
The methods of preparing the liquid compositions as indicated by "A", "B", and "C" in Table 1 are as follows:
Method A
The epoxy resin, curing agent, the filler, and the other ingredients (except for the porous and hollow filler particles) were blended in listed amounts followed by being intermingled with a planetary mixer and dispersed by means of a triple-roll. After being added with porous or hollow filler particles, the resulting mixture was stirred by the planetary mixer to prepare the liquid resin composition.
Method B
The epoxy resin, curing agent, and the other ingredients were blended in listed amounts followed by being intermingled with a planetary mixer and dispersed by means of a triple-roll to prepare the liquid resin composition.
Method C
The epoxy resin, curing agent, and the other ingredients (except for the porous and hollow filler particles) were blended in listed amounts followed by being intermingled with a planetary mixer and dispersed by means of a triple-roll. After being added with porous or hollow filler particles, the resulting mixture was stirred by the planetary mixer to prepare the liquid resin composition.

Measurements were made to evaluate characteristics of the liquid resin compositions of Examples 1 to 5, and Comparative Examples 1 to 3 by the following methodology. The measurement results are listed in Table 1.

(1) Processing Conditions

As shown in FIG. 1, the liquid composition was applied over a substrate (200 μm thick wafer) to form a 200 μm thick resin layer 2. Then, measurements were made to examine wear amount of the dicing blade 3 and a spindle current when singularizing the wafer by rotating the dicing blade of a dicing tool. Processing condition, the tool and the blade employed in the processing are as follows.
Dicing Tool:
Available from Disco Corporation under the trade name of "DFD6340 fully automatic dicing saw".
Blade:
Available from Disco Corporation under the trade name of "NBC-ZH2050".

Cutting Conditions:
Spindle rotation speed of 35000 rpm, feeding speed of 50 mm/s, cutting distance of 9.8 m, with pure water as cutting water.

(2) Viscosity of Liquid Resin Composition

B-type visometer was employed for viscosity measurement at a room temperature of 25° C.

(3) Glass Transition Temperature (Tg)

Using a dynamic mechanical analyzer (DMA) to measure the glass transition temperature of specimens at a bending mode of 10 Hz. The specimens ware prepared by heating the liquid resin composition at 130° C. for 1 hour, and subsequently at 180° C. for 3 hours, and were cut out into a rectangular shape having a length of 50 mm, a width of 5 mm, and a thickness of 0.2 mm. Measurements were made at a temperature rise rate of 2° C./min over a range of −60° C. to 260° C.

(4) Flexural Elastic Modulus

The liquid resin composition was cured to prepare specimens having a length of 70 mm or more, a width of 10 mm, and a thickness of 3 mm. A tensile-compressive testing machine was used to make 3-point flexure test for measurement of the flexural elastic modulus. The testing was made by applying a load at a bending rate of 2 mm/minutes until the specimen was broken. The liquid composition was cured by being heated at 130° C. for 1 hours followed by being heated at 180° C. for 3 hours.

(5) Coefficient of Linear Thermal Expansion

A thermomechanical analyzer (TMA) was used to measure the coefficient of linear thermal expansion of specimens. The specimen was prepared by heating the liquid resin composition at 130° C. for 1 hours followed by heating at 180° C. for 3 hours, and dimensioned to have a length of 70 mm or more, a width of 10 mm, and a thickness of 1 to 3 mm. The specimen was heated at a raising rate of 5° C./min over a range of −60° C. to 260° C.

(6) Warp

The liquid resin composition was applied over the surface of 5-inch diameter wafer of 200 μm thickness to form thereon a 110 mm diameter resin layer of 0.2 μm thick, and was heated at 130° C. for 1 hour followed by being heated at 180° C. for 3 hours. The wafer covered with thus cured resin layer was pressed at one circumferential point to measure a maximum vertical displacement (along Z-axis) and evaluate the warm thereby.

(7) Resin Stiffness

A pencil scratch hardness tester was used to evaluate the resin stiffness according to a method prescribed in JIS (Japanese Industrial Standards K 5600. The specimens employed for measurement of the resin stiffness were prepared as utilized in the above test of measuring the flexural elastic modulus.

(8) Pressure Cooker Test (PCT)

The liquid composition was applied over a substrate (200 μm thick wafer) to form a 200 μm thick resin layer 2. Then, the substrate was singularized wafer chips of 5 mm×5 mm by use of the dicing blade 3 under the same conditions as described in the above processing conditions. The singularized wafer chips were treated for 300 hours under pressure cooker testing conditions of 121° C. and 2 atm (0.20 Mpa), and thereafter were tested to examine pencil hardness of the cured resin.

(9) Temperature Cycle Reliability Test

The wafer chips employed in the above pressure cooker test were subjected to different numbers of temperature cycles increasing by a step of 100 cycles up to 1000 cycles. Each one cycle, the wafer chip was subjected to a temperature of −65° C. for 5 minutes, and a temperature of 150° C. for 5 minutes.

10 pieces of the wafer chips were provided for each of Examples and Comparative Examples, and were observed whether or not the resin layer was peeled off to evaluate reliability in terms of the number of the cycles where 5 pieces out of 10 see the peeling.

(10) Reflow Resistance Evaluation

The wafer chips employed in the above pressure cooker test were subjected to a moisture absorbing environment of 85° C. and 85% RH, and subsequently treated twice in a reflow furnace having a peak temperature of 263° C. 10 pieces of the wafer chips were provided for each of Examples and Comparative Examples, and were observed whether or not the resin layer was peeled off after being treated in the reflow furnace in order to give evaluation in terms of the number of pieces seeing no peel of the resin layer.

As apparent from Table, it is confirmed that Example 1 employing the hollow silica shows superior wear resistance and low warp, in addition to improved reliability in the other performances;

Example 2 employing the porous silica as well as the hollow silica also shows superior wear resistance, low warp, and the like improved reliability, yet reducing viscosity and thixotropic index.

Example 3 employing the surface-sealed porous silica with a reduced amount of elastomer shows the increase of the resin stiffness.

Example 4 employing only the surface-sealed porous silica as the filler shows a remarkable effect of minimizing the wear on the dicing blade.

Example 5 employing only the surface-open porous silica as the filler shows satisfactory performances but with somewhat higher the viscosity and thixotropic index than Examples 1 to 4.

In contrast, Comparative Example 1 shows a low warp, but a relatively low glass transition temperature (Tg) and insufficient resin stiffness. Comparative Example 2 shows greater coefficient of linear thermal expansion and warp due to the absence of the porous or hollow silica. Comparative Example 3 shows remarkable lower resin stiffness due to the absence of the porous or hollow silica and also the use of acid anhydrate as the curing agent.

| | | | Examples | | | | | Comparative Examples | | |
|---|---|---|---|---|---|---|---|---|---|---|
| | | | 1 | 2 | 3 | 4 | 5 | 1 | 2 | 3 |
| Ingredient | Solid amorphous silica | 9 μm (avr)/35 μm (max) | — | — | — | — | — | 647.7 | 495.2 | 770.0 |
| | Solid amorphous silica | 0.6 μm (avr)/3.5 μm (max) | 427.9 | 203.3 | 272.2 | — | 342.9 | 215.9 | 212.2 | — |
| | Hollow silica | 3 μm (avr)/25 μm (max), 50% porosity | 320.6 | 203.3 | — | — | — | — | — | — |
| | Porous silica (sealed surface) | 10 μm (avr)/30 μm (max), 20% porosity | — | 333.5 | 520.8 | 686.2 | — | — | — | — |
| | Porous silica (sealed surface) | 2 μm (avr)/25 μm (max), 17% porosity | — | — | — | 173.6 | — | — | — | — |
| | Porous silica (open-surface) | 6 μm (avr)/30 μm (max), 33% porosity | — | — | — | — | 397.5 | — | — | — |
| | Bisphenol-F epoxy resin | Epoxy equivalent 160 | — | — | 20.4 | — | 25.7 | 16.8 | 31.7 | — |
| | Bisphenol-A epoxy resin | Epoxy equivalent 175 | 2.4 | 2.4 | 60.8 | 1.6 | 76.4 | 7.9 | 94.2 | 23.3 |
| | Alicyclic epoxy resin | Epoxy equivalent 135 | 12.7 | 12.6 | — | 8.5 | — | — | — | — |
| | Naphthalene-ring containing epoxy resin | Epoxy equivalent 141 | 44.7 | 43.9 | — | 30.3 | — | — | — | 93.7 |
| | Polypropylene/epoxy resin | Epoxy equivalent 319 | — | — | — | — | — | 19.1 | — | — |
| | Allyl phenol | Hydroxyl equivalent 141 | 32.5 | 31.9 | 34.8 | 22.1 | 43.8 | 30.4 | 53.9 | — |
| | Acid anhydrate | Acid anhydrate equivalent 168 | — | — | — | — | — | — | — | 112.3 |
| | Low elastic agent | Silicone rubber | 47.2 | 46.1 | 20.4 | 32.0 | 25.7 | 15.8 | 31.7 | — |
| | Solvent (Diethylene glycol diethyl ether) | Boiling point 180° C. | — | — | — | — | — | 19.2 | — | — |
| | Solvent (Dimethylpropylene diglycol) | Boiling point 170° C. | — | — | — | — | — | 6.3 | — | — |
| | Solvent (Dibuthyl diglycol) | Boiling point 250° C. | 80.7 | 91.7 | 42.5 | 18.4 | 53.5 | — | 40.2 | — |
| | Curing accelerator | Microcapsulated latent curing accelerator | 7.6 | 7.5 | 8.7 | 5.3 | 11.0 | 4.8 | 13.5 | — |
| | Colorant | Carbon | 6.4 | 6.1 | 4.1 | 5.7 | 5.2 | 2.4 | 4.0 | 0.6 |
| | Coupling agent | | 5.4 | 5.3 | 4.5 | 5.1 | 5.7 | 4.4 | 7.1 | — |
| | dispersant | | 12.2 | 12.0 | 10.3 | 11.5 | 13.0 | 9.6 | 16.1 | — |
| Total | | | 1000 | 1000 | 1000 | 1000 | 1000 | 1000 | 1000 | 1000 |
| method | | | C | C | B | A | C | B | A | B |
| Results | Viscosity (Pa · s) | 25° C., B-type viscometer (20 rpm, No. 7 rotor) | 113.0 | 35.0 | 35.0 | 25.0 | 125.0 | 40.0 | 47.0 | 110.0 |
| | Thixotropix index | 25° C., B-type viscometer (2.5 rpm/20 rpm) | 3.8 | 1.7 | 1.0 | 1.8 | 3.5 | 1.2 | 1.1 | 1.2 |
| | Glass transition temperature (Tg) (° C.) | DMA 10 Hz, 2° C./min bending mode | 100 | 100 | 100 | 100 | 100 | 50 | 100 | 160 |
| | Flexural elastic modulus (Pa) | Tensile-compressive testing (3-point flexure) | 3.0 | 3.5 | 4.0 | 4.0 | 3.0 | 1.2 | 3.0 | 4.0 |
| | Linear thermal expansion coefficient (ppm/° C.) | TMA 5° C./min | 8 | 10 | 10 | 10 | 13 | 12 | 20 | 15 |
| | After cured resin stiffness | Pencil scratch stiffness 25° C. | 6 H | 6 H | 8 H | 7 H | 5 H | 3 H | 7 H | 9 H |
| | Blade wear (μm) | NBC-ZH2050 (DISCO corporation) | 6 | 4 | 5 | 3 | 2 | 22 | 28 | 18 |
| | Spindle current (A) | 1.2 kW spindle | 85 | 82 | 84 | 80 | 80 | 95 | 100 | 85 |
| | Warp (mm) | 200 μm thick resin on 5φ. 200 μm thick wafer | 1 | 3 | 6 | 5 | 9 | 2 | 24 | 23 |

-continued

|  |  | Examples | | | | | Comparative Examples | | |
|---|---|---|---|---|---|---|---|---|---|
|  |  | 1 | 2 | 3 | 4 | 5 | 1 | 2 | 3 |
| Temperature cycle | −65° C. 5 min <----> 150° C. 5 min | 1000 | 1000 | 1000 | 1000 | 800 | 1000 | 200 | 300 |
| Pressure cooker test | 121° C. 100% 2 atm | 6 H | 6 H | 7 H | 6 H | 4 H | 3 H | 5 H | HB |
| Reflow resistance (non-peeled chip number) | 85° C., 85%, 24 hrs, reflow twice (peak 263° C.) | 10 | 10 | 10 | 10 | 10 | 10 | 2 | 0 |

The invention claimed is:

1. A room-temperature liquid sealing resin composition adapted in use to be applied to a substrate of an electronic component,
said resin composition comprising:
60% to 90% by weight of filler particles;
an epoxy resin;
a curing agent; and
silicone rubber elastomer;
wherein
said filler particles include 40% or more by weight of porous and/or hollow particles, and
said silicone rubber elastomer is contained in an amount of 2 to 5 wt% based on a total amount of said resin composition.

2. The room-temperature liquid sealing resin composition as set forth in claim 1, wherein
said porous andior hollow particles have a porosity of 10% to 70%.

3. The room-temperature liquid sealing resin composition as set forth in claim 1, wherein
said porous particles are bake-finished to have their surface sealed.

4. The room-temperature liquid sealing resin composition as set forth in claim 1, wherein
said filler particles have a maximum particle size of 1 μm to 40 μm.

5. The room-temperature liquid sealing resin composition as set forth in claim 1, wherein
said filler particles are made of spherical amorphous silica.

6. The room-temperature liquid sealing resin composition as set forth in claim 1, wherein
said epoxy resin is at least one selected from the group consisting of bisphenol-A epoxy resin, bisphenol-F epoxy resin, biphenyl epoxy resin, naphthalene-ring containing epoxy resin, hydrogenated epoxy resin thereof, alicyclic epoxy resin, and polyalkylene glycol skeleton containing epoxy resin.

7. The room-temperature liquid sealing resin composition as set forth in claim 1, wherein
said curing agent is a compound having a plurality of phenolic hydroxyl groups per one molecule.

8. A process of fabricating semiconductor devices with the use of the room-temperature liquid sealing resin composition as defined in claim 1, said process comprising the steps of:
applying said liquid sealing resin composition on a resin substrate, ceramic substrate, or wafer by means of a reduced pressure printing machine;
heating said liquid sealing resin composition to cure; and
singulating the substrate or wafer into individual parts of the semiconductor devices.

9. A semi-conductor device comprising:
a semi-conductor chip formed on its one surface with a semiconductor circuit;
a resin layer superimposed on said semi-conductor chip over said circuit; and
a plurality of electrodes connected to said semi-conductor chip and extending through said resin layer,
said resin layer being formed from said liquid sealing resin composition as defined in claim 1.

10. A method of preparing the room-temperature liquid sealing resin composition as defined in claim 1, said method comprising the steps of:
providing a mixture of
60% to 90% by weight of filler particles;
an epoxy resin;
a curing agent; and
silicone rubber elastomer,
stirring the mixture to obtain the sealing resin composition,
wherein said filler particles include 40% or more by weight of porous and/or hollow particles,
said mixture includes said porous and/or hollow particles which are bake-finished to have their surfaces sealed, and
said silicone rubber elastomer is contained in an amount of 2 to 5 wt% based on a total amount of said resin composition.

11. A method of preparing the room-temperature liquid sealing resin composition as defined in claim 1, said method comprising the steps of:
mixing an epoxy resin, a curing agent, and silicone rubber elastomer to form a uniform mixture;
adding 60% to 90% by weight of filler particles to the mixture; and
stirring the resulting mixture to obtain the sealing resin composition,
wherein said filler particles include 40% or more by weight of porous and/or hollow particles, and
said silicone rubber elastomer is contained in an amount of 2 to 5 wt % based on a total amount of said resin composition.

* * * * *